United States Patent [19]
Takiar

[11] Patent Number: 5,621,635
[45] Date of Patent: Apr. 15, 1997

[54] INTEGRATED CIRCUIT PACKAGED POWER SUPPLY

[75] Inventor: Hem Takiar, Fremont, Calif.

[73] Assignee: National Semiconductor Corporation, Santa Clara, Calif.

[21] Appl. No.: 397,950

[22] Filed: Mar. 3, 1995

[51] Int. Cl.⁶ .................................................. H05K 7/20
[52] U.S. Cl. ............................................................ 363/141
[58] Field of Search ................................. 363/140–141, 363/67–70, 126, 144–145, 146; 361/386, 388, 389; 307/150

[56] References Cited

U.S. PATENT DOCUMENTS

| | | | |
|---|---|---|---|
| 4,488,202 | 12/1984 | Kaufman | 361/386 |
| 4,635,179 | 1/1987 | Carsten | 363/70 |
| 4,712,160 | 12/1987 | Sato et al. | 361/388 |
| 4,722,060 | 6/1988 | Quinn et al. | 364/490 |

FOREIGN PATENT DOCUMENTS 3237747  1/1992  Japan .

OTHER PUBLICATIONS

Brochure, "About Our Company," by Power Trends, Inc., undated, one page in length.
Brochure, "DC/DC Converter Thermal Characteristics," by Conversion Devices, Inc., undated, two pages in length.
Book, *Microelectronics Packaging Handbook*, Edited by R.R. Tummala & E.J. Rymaszewski, 1989, Publishers: Van Nostrand Reinhold, Chapter 9.2.3, "Power Supply and Heat Removal", pp. cover, copyright, and 684–685.
Book, *Modern DC–To–DC Switchmode Power Converter Circuits*, by R.P. Severns & G. (Ed) Bloom, Chapter 1, "Introduction to Switchmode Power Converters," 1988, Publishers: Van Nostrand Reinhold (New York), pp. cover and 1–10.

*Primary Examiner*—Aditya Krishnan
*Attorney, Agent, or Firm*—Limbach & Limbach L.L.P.

[57] ABSTRACT

A design for and method of assembling a power supply or power converter. The design is based on mounting the heat generating elements of the device, such as an integrated circuit or other switching device in a manner which provides a direct thermal coupling between those devices and the inductors or transformers which are part of the power supply or converter Using packaging techniques similar to those used in the semiconductor industry, the inductor or transformer is attached to one side of a lead frame. The heat generating elements are then mounted on top of the inductor or transformer. Passive components, such as capacitors, may be mounted on the lead frame. Additional heat generating components may also be mounted on the inductor or transformer. The resulting combination is then encapsulated in plastic or a molding compound typically used in the industry.

20 Claims, 3 Drawing Sheets

100

INTEGRATED CIRCUIT PACKAGED POWER SUPPLY

FIELD OF THE INVENTION

The present invention relates to power supplies and power converters, and more specifically, to a design for such devices which uses integrated circuit packaging methods to produce a more compact and reliable device than those presently available.

BACKGROUND OF THE INVENTION

A power converter or power supply is a device which converts one form of energy to another, with the two terms being used interchangeably. There are several types of power converters typically used in the semiconductor industry: (1) direct current (dc) to direct current converters; (2) alternating current (ac) to direct current converters; (3) dc to ac converters; and (4) ac to ac converters. The circuit components used to fabricate such devices include inductors, capacitors, resistors, transformers, and switching elements, where the switching elements are usually in the form of an integrated circuit which performs the control functions for the overall device.

FIG. 1 is a representation of a typical dc to dc power converter 10. Converter 10 is connected at the input side to a source 12 which provides a signal to be converted, and at the output side to a load 14. Converter 10 is constructed from the elements described previously; switching elements 16, inductors 18, transformers 20, and passive, discrete elements, such as capacitors 22. Switching elements 16 may take the form of a fast recovery diode, a bipolar junction transistor, a MOSFET, a gate turn-off thyristor, or other similarly functioning components. The power conversion function required in a specific situation will be accomplished by a combination of the above elements, where the switching or control elements are often manufactured in the form of an integrated circuit chip.

FIG. 2 is a schematic of a typical circuit for an ac to dc converter 30. In this circuit, a dc to dc converter 32 is preceded by a rectifier-filter network 34. An ac signal 36 is input to ac to dc converter 30, the signal is transformed to a dc signal by the action of network 34, and the resultant signal is then converted by the action of dc to dc converter 32. A load 38 is connected to the output of dc to dc converter 32. Direct current to alternating current (dc to ac) and alternating current to alternating current (ac to ac) converters typically use ac to dc and dc to dc converters as sub-systems which are combined to obtain the desired output.

The components of a power supply or converter are typically mounted on a printed circuit board or ceramic substrate using surface mounting, through-hole, or chip-on-board technologies known in the industry. As mentioned above, the switching elements may be in the form of an integrated circuit which is mounted separately on the board from the passive elements, inductor(s), and transformer(s), using either the surface mounting or through-hole mounting techniques mentioned. The entire board or substrate is then enclosed in a plastic case or encapsulated in plastic.

FIG. 3 is a cut-away view illustrating the design of a typical prior art dc to dc power converter 100. In this example, a transistor 120 or other heat generating element is surface or through-hole mounted on a printed circuit board 122. Heat generating element 120 may be in thermal contact with a heatsink 124 in order to provide better dissipation of the heat generated by element 120 during operation of power converter 100. Other elements 125 and 126 of the circuitry of power converter 100 are similarly mounted on printed circuit board 122. An encapsulating compound 128 can then be used to enclose the components of power converter 100, although the use of this compound is optional. A case 130 is then used to complete the package. As shown in FIG. 3, a package heatsink 132 may be placed in thermal contact with and attached to converter package 130 to provide added heat dissipation from the components within package 130 to the ambient environment. In such a situation, a thermal compound 134 may be placed between package 130 and heatsink 132 to provide the desired degree of heat conduction between those elements.

A primary heat source of the power converter 100 of FIG. 3 is the IR drop across the collector to emitter potential of transistor 120. The power drop across the junction resistance of transistor 120 is dissipated as heat. In the case of the simple example of FIG. 3, the heat generated by transistor 120 must be conducted through several thermal interfaces prior to being conducted out to the ambient environment. These interfaces include: 1) the collector to emitter junction to the transistor case; 2) the transistor case to the transistor heatsink; 3) the heatsink to the encapsulating compound and/or printed circuit board; 4) the printed circuit board to the encapsulating compound; 5) the encapsulating compound to the package case; and 6) the package case to the thermal compound and package heatsink if one is used. As the generated heat is conducted through each thermal interface, a temperature drop will occur. This reduces the efficiency with which the heat initially generated by the transistor can be removed from the package.

As noted, the electrical power delivered to the power supply or converter results in the internal production of large amounts of heat. The heat generated by the components of the converter must be removed efficiently in order to prevent failure of the device. This is because most all of the common failure mechanisms are enhanced as the result of an increase in temperature.

Heat removal from power supplies and converters is typically achieved by use of a thermally enhanced printed circuit board which contains a metal wafer on one side to conduct the heat away from the components. A printed circuit board made of a composite material having a relatively high heat capacity may also be used, although this solution to the problem may be too expensive for use in a large scale manufacturing environment. One or more heat sinks may also be affixed to the board to assist with heat dissipation. A heat sink may also be attached to the outside of a package containing a power supply or converter to assist with dissipating the heat conducted through the package. Once the heat is transferred to the case or package of a power supply by means of conduction, convective processes transfer the heat to the ambient environment.

Even with these approaches to heat dissipation, presently available power supplies and power converters have several disadvantages. The devices are relatively large in size since all of the components are laid out on a printed circuit board. This can impact the final size of products in which they are incorporated. For instance, such power supply and power converter designs are generally unsuited for use in portable electronic products. Power supply and converter designs which utilize many thermal interfaces between the heat generating components and the ambient environment are often inefficient dissipators of heat. Another issue is that the cost of manufacturing the device can become excessive if a ceramic substrate or thermally enhanced board is used. In addition, the devices lack the high degree of reliability which can be obtained by the use of modem semiconductor packaging techniques. This is because the method of connecting the components to the printed circuit board and the heat dissipation ability of the final product can be sources of device failure which are not present when some modem packaging methods, such as transfer molding, are used.

What is desired is a design for and method of assembling a power supply or power converter which produces a smaller, less expensive, and more reliable device than those presently available. It is also desirable to have a more efficient design for removing heat from the power supply or converter by reducing the number of thermal interfaces between the heat generating components and the ambient environment.

SUMMARY OF THE INVENTION

The present invention is directed to a design for and method of assembling a power supply or power converter. The invention is based on mounting the heat generating elements of the device, such as integrated circuits or other switching elements, in a manner which provides a direct thermal coupling between those devices and the inductors or transformers contained in the circuit. This allows the inductor or transformer to serve as a heat conduction path to assist with spreading the heat generated by the switching elements, prior to dissipating the heat to the outside environment.

Using packaging techniques similar to those used in the semiconductor industry, the inductor or transformer is attached to one side of a lead frame. The heat generating elements are then mounted on the top or bottom of, and in thermal contact with, the inductor or transformer. The other passive components (capacitors, etc.) are mounted on the lead frame. In some cases capacitors may be heat generating elements, and therefore may be mounted in thermal contact with inductor or transformer. The resulting combination is then encapsulated in plastic or a molding compound using methods known in the industry.

The heat generated by the switching (and other heat generating) elements is transferred by conduction to the inductor or transformer, which acts as a heat spreader. The inductor or transformer transfers the heat by conduction to the lead frame. The heat is then transferred to the outside of the package by the lead frame and lead frame leads which provide a good thermal conduction path for the heat transferred to the inductor or transformer. The heat is finally removed from the package by convective processes which transfer the heat to the ambient environment. A power supply or power converter of this design is more compact and can be produced at a lower cost than presently available devices. In addition, the power supply or power converter of the present invention is more reliable than present devices. The increased reliability results from a combination of improved heat removal and the use of modem integrated circuit packaging techniques.

Further objects and advantages of the present invention will become apparent from the following detailed description and accompanying drawings.

DETAILED DESCRIPTION OF THE PREFERRED EMBODIMENT

Figure 1:
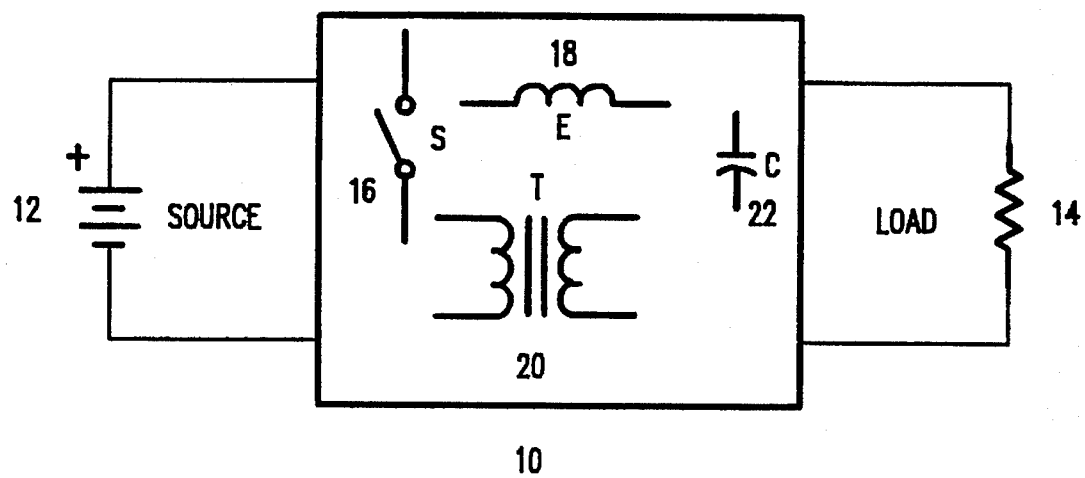
FIG. 1 is a representation of a typical dc to dc power converter.
Figure 2:
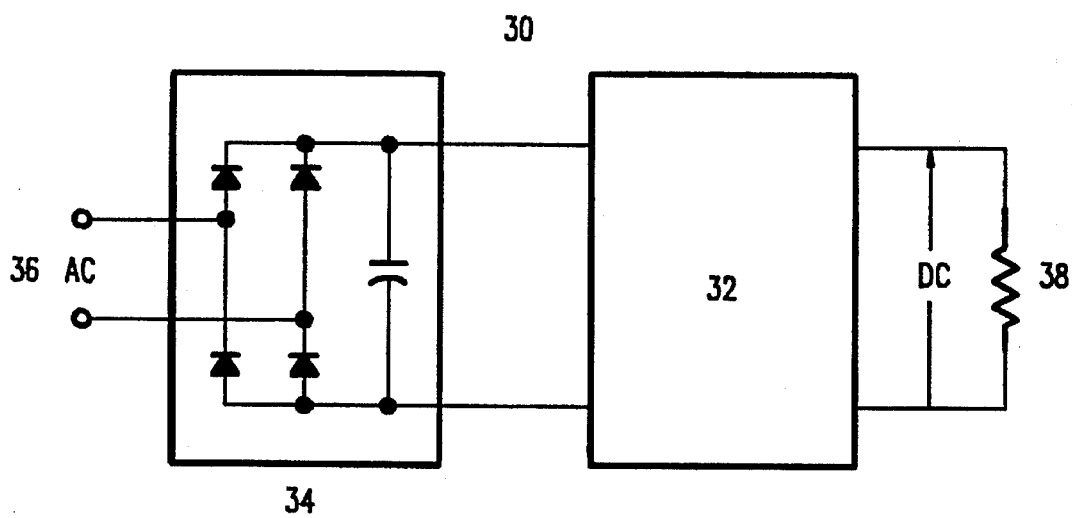
FIG. 2 is a schematic of a typical circuit for an ac to dc converter.
Figure 3:
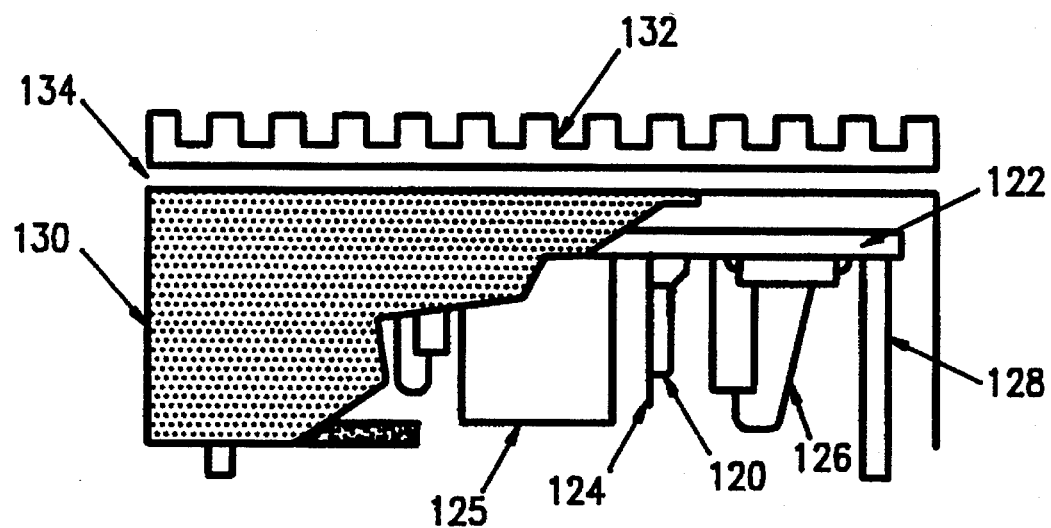
FIG. 3 is a cut-away view illustrating the design of a typical prior art dc to dc power converter.
Figure 4:
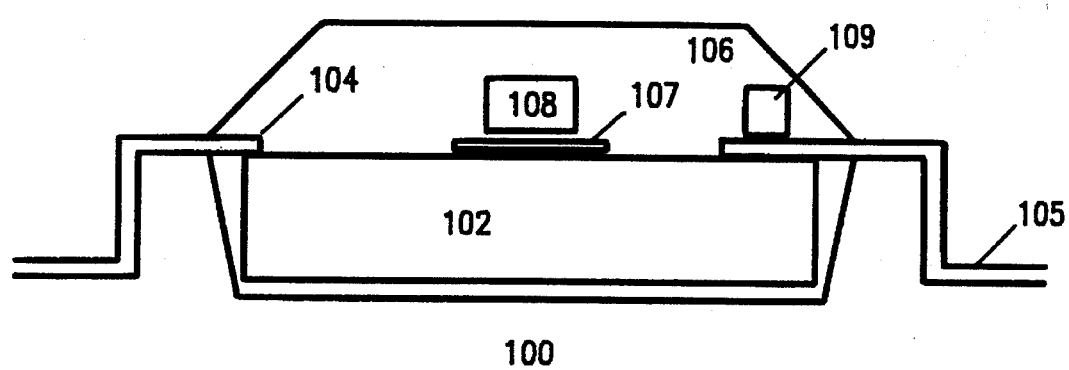
FIG. 4 is a cross-section view of a first embodiment of the integrated circuit packaged power supply of the present invention.

FIG. 4 is a cross-section view of a first embodiment of the integrated circuit packaged power supply 100 of the present invention. Power supply or power converter 100 includes an inductor or transformer 102 which is attached to a lead frame 104. Lead frame 104 has leads 105 which extend out of the package containing power supply 100. The heat generating elements of power supply or power converter 100 are mounted on, and in direct thermal contact with, inductor or transformer 102. These heat generating elements are usually fabricated in the form of an integrated circuit 108 and may include switching elements such as bipolar transistors or field effect transistors. The passive elements 109 such as capacitors, which are part of the power supply circuitry, are mounted on lead frame 104. In the situation where some of these additional elements are themselves heat generating, they too may be mounted on and in thermal contact with inductor or transformer 102. Electrical connection between inductor or transformer 102 and integrated circuit 108 is provided by lead frame 104 to which inductor or transformer 102 is connected. The entire package is sealed and encapsulated by a molding compound 106. The use of molding compound 106 is optional, and is typically used to improve the physical integrity of the final package. The resulting product is a power supply or power converter which is in the form of a typical integrated circuit package, such as those commonly used in the semiconductor industry.

Inductor or transformer 102 is attached to lead frame 104 by means of a suitable adhesive. The integrated circuit die 108 containing the heat generating components can be mounted on inductor or transformer 102 directly by using an adhesive or by means of an intermediate die attach pad 107. The entire device 100 is then encapsulated by means of standard transfer molding, injection molding, or similar methods known in the semiconductor industry. It is noted that inductor or transformer 102 may sometimes be encapsulated prior to mounting on lead frame 104. In such a case, the transfer of heat from the heat generating elements mounted on the inductor to inductor 102 is not as efficient as when those elements are mounted directly on an unencapsulated inductor.

Figure 5:
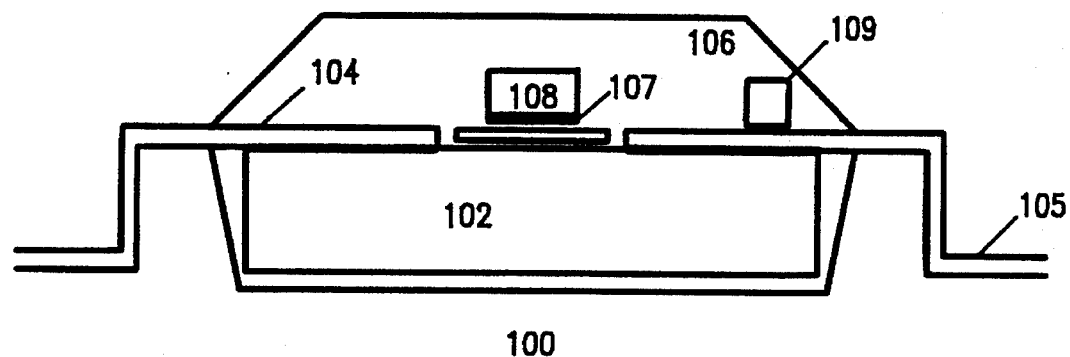
FIG. 5 is a cross-section view of a second embodiment of the integrated circuit packaged power supply of the present invention.

FIG. 5 is a cross-section view of a second embodiment of the integrated circuit packaged power supply 100 of the present invention. In this embodiment, power supply or power converter 100 again includes an inductor or transformer 102 which is attached to a lead frame 104, where lead frame leads 105 extend out of the package containing power supply 100. However, in this embodiment, integrated circuit die 108 on which are fabricated the heat generating elements of power supply or power converter 100 is mounted on lead frame 104. The passive components 109 which are part of the circuitry are again mounted on lead frame 104. The entire package is then sealed and encapsulated by a molding compound 106. As with the prior embodiment of the invention, inductor or transformer 102 is attached to lead frame 104 by means of a suitable adhesive. Integrated circuit die 108 can be mounted directly on lead frame 104 using an adhesive or by means of an intermediate die attach pad 107. The entire device 100 is then encapsulated by standard transfer molding, injection molding, or similar methods known in the semiconductor industry.

The integrated circuit packaged power supply of the present invention can also be assembled without the use of molding techniques. For example, integrated circuit die 108 may be subjected to the packaging method known as "glob-topping", wherein a liquid encapsulant is poured over die 108 and allowed to harden. This serves to affix and seal die 108 to lead frame 104. After this step, a plastic cap is mounted on the top and bottom of the package.

Figure 6:
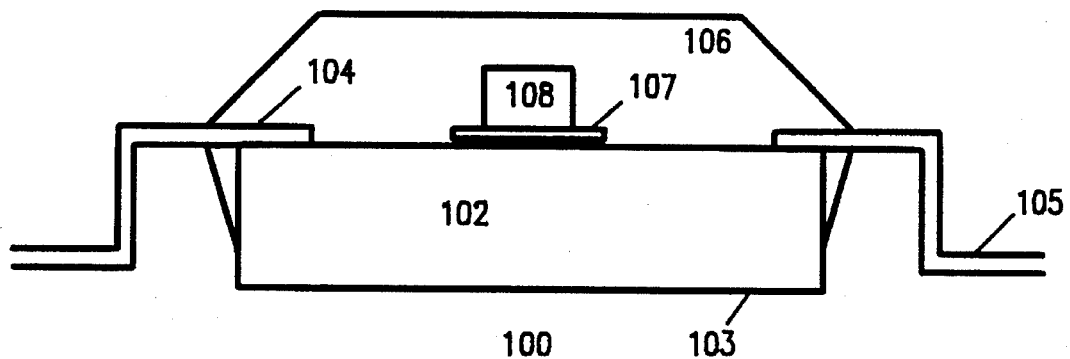
FIG. 6 is a cross-section view of a third embodiment of the integrated circuit packaged power supply of the present invention.

FIG. 6 is a cross-section view of a third embodiment of the integrated circuit packaged power supply 100 of the present invention. Power supply or power converter 100 again includes an inductor or transformer 102 which is attached to a lead frame 104. Lead frame 104 has leads 105 which extend out of the package containing power supply 100. The heat generating elements 108 of power supply or power converter 100 are mounted on, and in direct thermal contact with, inductor or transformer 102. The entire package is sealed and encapsulated by a molding compound 106. As with previous embodiments of the present invention, the heat generating components 108 can be mounted on inductor or transformer 102 directly by using an adhesive or by means of an intermediate die attach pad 107.

In this embodiment, power supply 100 is constructed so that the bottom side 103 of inductor or transformer 102 forms the base of the package. In this situation, added heat dissipation is provided because a surface of inductor or transformer 102 is exposed to the environment outside of the package. This permits more efficient heat transfer from inductor or transformer 102 to the ambient environment because the heat conducted by inductor 102 can be transferred directly to the environment by means of convection, instead of having to be conducted through a layer of molding compound 106. Although FIG. 6 depicts power supply 100 having heat generating components 108 mounted directly on inductor 102, other embodiments, such as those in which heat generating components 108 are mounted on a lead frame (such as shown in FIG. 5) are also possible and are considered to be within the described embodiment.

In accordance with the present invention, there has been described an integrated circuit packaged power supply or power converter and a method of assembling the same. This design utilizes packaging techniques used in the semiconductor industry to produce a device which is more compact and more reliable than currently available power supplies or power converters. By mounting the heat generating components directly onto an inductor or transformer, a highly effective thermal path for heat dissipation is provided between the components producing the heat and the outside of the package. The heat generated by the components is conducted through the body of the inductor or transformer to a lead frame, and then by means of the lead frame leads, to the outside environment. This provides superior heat dissipation to what is achieved when all of the components are surface mounted on a printed circuit board where the heat generated must be transferred through the board (and in some cases the encapsulating material) to the outside environment. The heat generating components can also be mounted directly on the lead frame, again providing a more effective path for heat conduction and dissipation. The final product is more compact, less expensive to produce, and more reliable than commonly used printed circuit board based designs.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. An integrated circuit packaged power supply or power converter, comprising:

a lead frame having a main body and leads extending from the main body;

an inductor or transformer attached to and in thermal contact with the main body of the lead frame; and an integrated circuit die which is a component of the power supply or power converter mounted on and in direct thermal contact with the inductor or transformer.

2. The integrated circuit packaged power supply of claim 1, further comprising:

a molding compound or encapsulant surrounding and encapsulating the main body of the lead frame, the inductor or transformer, and the integrated circuit die.

3. The integrated circuit packaged power supply of claim 1, further comprising:

a passive component of the power supply mounted on the lead frame.

4. The integrated circuit packaged power supply of claim 1, further comprising:

a heat generating component of the power supply mounted on the lead frame.

5. The integrated circuit packaged power supply of claim 1, further comprising:

a heat generating component of the power supply mounted on and in direct thermal contact with the inductor or transformer.

6. An integrated circuit packaged power supply or power converter, comprising:

a lead frame having a main body and leads extending from the main body, the main body having a first side and a second side opposite to the first side;

an inductor or transformer attached to and in thermal contact with the first side of the main body of the lead frame; and an integrated circuit die which is a component of the power supply or power converter mounted on and in thermal contact with the second side of the main body of the lead frame and on top of the inductor or transformer.

7. The integrated circuit packaged power supply of claim 6, further comprising:

a molding compound or encapsulant surrounding and encapsulating the main body of the lead frame, the inductor or transformer, and the integrated circuit die.

8. The integrated circuit packaged power supply of claim 6, further comprising:

a passive component of the power supply mounted on the lead frame.

9. The integrated circuit packaged power supply of claim 6, further comprising:

a heat generating component of the power supply mounted on the lead frame.

10. An integrated circuit packaged power supply or power converter, comprising:

a lead frame having a main body and leads extending from the main body, the main body having a first side and a second side opposite to the first side;

an inductor or transformer having an upper surface and a lower surface and attached to and in thermal contact with the first side of the main body of the lead frame;

an integrated circuit die which is a component of the power supply or power converter mounted on and in direct thermal contact with the upper surface of the inductor or transformer; and a molding compound or encapsulant surrounding and encapsulating the main body of the lead frame, the inductor or transformer, and the integrated circuit die, wherein the lower surface of the inductor or transformer is not encapsulated by the molding compound and is exposed to an ambient environment.

11. The integrated circuit packaged power supply of claim 10, further comprising:

a passive component of the power supply mounted on the lead frame.

12. The integrated circuit packaged power supply of claim 10, further comprising:

a heat generating component of the power supply mounted on the lead frame.

13. The integrated circuit packaged power supply of claim 10, further comprising:

a heat generating component of the power supply mounted on and in thermal contact with the inductor or transformer.

14. An integrated circuit packaged power supply or power converter, comprising:

a lead frame having a main body and leads extending from the main body, the main body having a first side and a second side opposite to the first side;

an inductor or transformer having an upper surface and a lower surface and attached to and in thermal contact with the first side of the main body of the lead frame;

an integrated circuit die which is a component of the power supply or power converter mounted on and in thermal contact with the second side of the main body of the lead frame and on top of the inductor or transformer; and a molding compound or encapsulant surrounding and encapsulating the main body of the lead frame, the inductor or transformer, and the integrated circuit die, wherein the lower surface of the inductor or transformer is not encapsulated by the molding compound and is exposed to an ambient environment.

15. The integrated circuit packaged power supply of claim 14, further comprising:

a passive component of the power supply mounted on the lead frame.

16. The integrated circuit packaged power supply of claim 14, further comprising:

a heat generating component of the power supply mounted on the lead frame.

17. The integrated circuit packaged power supply of claim 1, further comprising:

a die attach pad interposed between the integrated circuit die and the inductor or transformer.

18. The integrated circuit packaged power supply of claim 6, further comprising:

a die attach pad interposed between the integrated circuit die and the main body of the lead frame.

19. The integrated circuit packaged power supply of claim 10, further comprising:

a die attach pad interposed between the integrated circuit die and the inductor or transformer.

20. The integrated circuit packaged power supply of claim 14, further comprising:

a die attach pad interposed between the integrated circuit die and the main body of the lead frame.

* * * * *